United States Patent
Suhail

(10) Patent No.: US 7,236,402 B2
(45) Date of Patent: Jun. 26, 2007

(54) METHOD AND APPARATUS FOR PROGRAMMING/ERASING A NON-VOLATILE MEMORY

(75) Inventor: Mohammed Suhail, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 41 days.

(21) Appl. No.: 11/290,321

(22) Filed: Nov. 30, 2005

(65) Prior Publication Data

US 2007/0121387 A1 May 31, 2007

(51) Int. Cl.
*G11C 11/34* (2006.01)

(52) U.S. Cl. .............................. 365/185.22; 365/185.19

(58) Field of Classification Search ........... 365/185.22, 365/185.19, 185.24, 185.28, 185.29
See application file for complete search history.

(56) References Cited

U.S. PATENT DOCUMENTS

| | | | |
|---|---|---|---|
| 4,943,948 A | 7/1990 | Morton et al. | |
| 5,835,415 A | 11/1998 | Harari | |
| 5,909,399 A * | 6/1999 | Tanaka et al. | 365/185.33 |
| 5,963,480 A | 10/1999 | Harari | |
| 6,400,603 B1 | 6/2002 | Blyth et al. | |
| 6,462,988 B1 | 10/2002 | Harari | |
| 6,504,762 B1 | 1/2003 | Harari | |
| 6,510,081 B2 | 1/2003 | Blyth et al. | |
| 6,570,790 B1 | 5/2003 | Harari | |
| 6,650,570 B2 * | 11/2003 | Tanzawa et al. | 365/185.22 |
| 2002/0114185 A1 | 8/2002 | Blyth et al. | |
| 2003/0218920 A1 | 11/2003 | Harari | |

* cited by examiner

*Primary Examiner*—Vu A. Le
(74) *Attorney, Agent, or Firm*—Joanna G. Chiu; Susan C. Hill

(57) ABSTRACT

An integrated circuit (10) having non-volatile memory (NVM) (14) includes a threshold selector (28) which selects a first one of a plurality of read current/voltage thresholds during a first portion of a program/erase cycle, and which selects a second one of a plurality of read current/voltage thresholds during a second portion of said program/erase cycle, wherein the first one of a plurality of read current/voltage thresholds and the second one of a plurality of read current/voltage thresholds are different. The first portion of the program/erase cycle occurs in time before the second portion of the program/erase cycle. The second one of the plurality of read current/voltage thresholds is less than the first one of the plurality of read current/voltage thresholds.

20 Claims, 5 Drawing Sheets

METHOD AND APPARATUS FOR PROGRAMMING/ERASING A NON-VOLATILE MEMORY

FIELD OF THE INVENTION

The present invention relates to non-volatile memory, and more particularly, to a method and apparatus for programming/erasing a nonvolatile memory.

RELATED ART

Non-volatile memory (NVM) which is capable of being programmed and erased multiple times is commonly used in a wide variety of applications. Generally, the NVM has a maximum number of program/erase cycles that can be performed while ensuring that a data retention specification is met.

BRIEF DESCRIPTION OF THE DRAWINGS

The present invention is illustrated by way of example and not limited by the accompanying figures, in which like references indicate similar elements, and in which.

Figure 1:
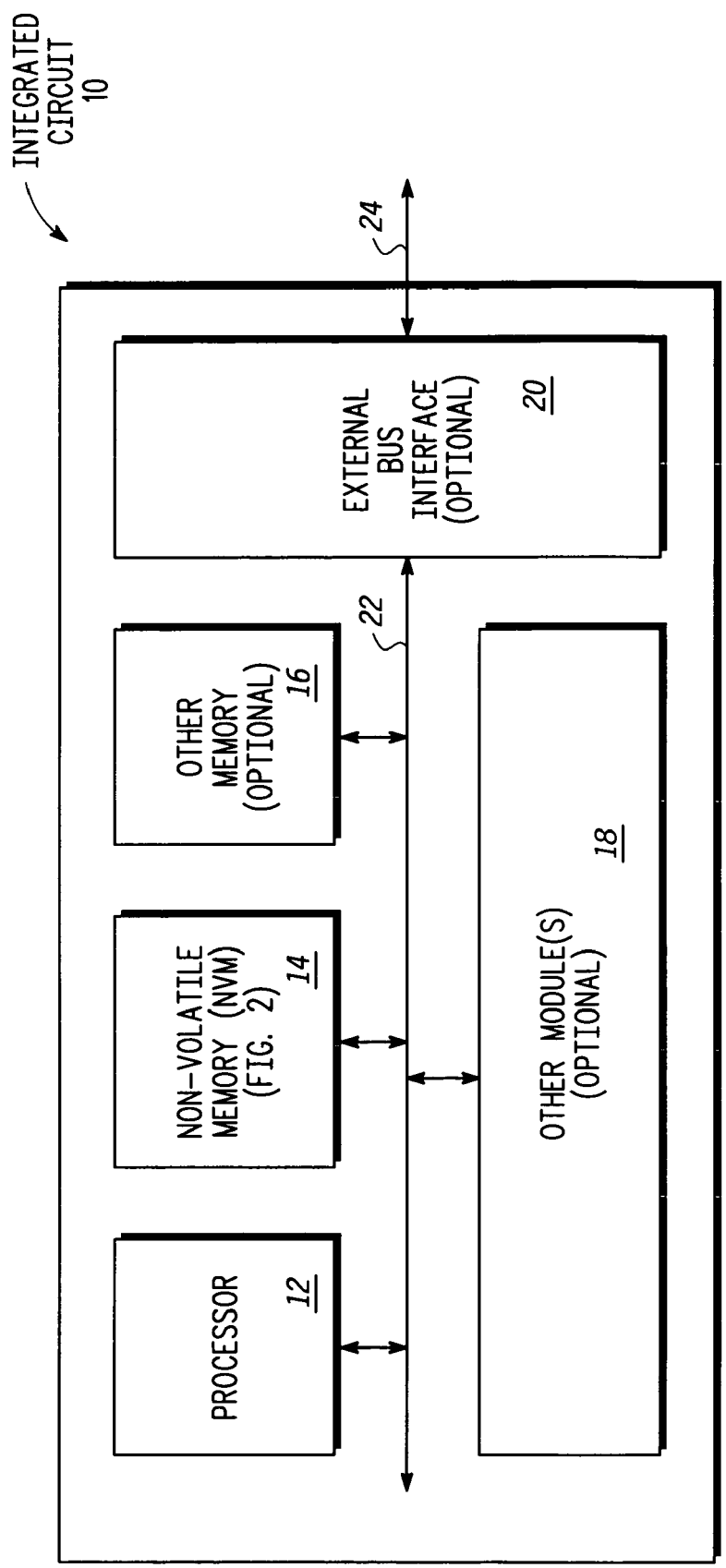
FIG. 1 illustrates, in block diagram form, an integrated circuit in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The data retention of an NVM cell is the amount of time that a predetermined data value will remain properly stored so that it is retrievable from the NVM cell. The endurance of the NVM cell is the maximum number of program/erase cycles that can be performed before the state of the NVM cell can no longer be reliably changed. Note that there are a variety of techniques that may be used to extend the viability of an NVM array when one or more NVM cells have failed either during testing or during usage (e.g. redundancy, error correction code, etc.).

NVMs may be programmed with any desired granularity. Although many NVMs are programmed on a per byte basis, alternate embodiments may be programmed on a bit, word, long word, sector, block, or any other desired basis. NVMs may be erased with any desired granularity. Although many NVMs are erased on a per sector basis, alternate embodiments may be erased on a bit, byte, word, long word, block, or any other desired basis.

One problem arises when a single NVM array 30 (see FIG. 2) must meet a maximum specification for data retention that is required by a first group of customers, while also meeting a maximum specification for endurance that is required by a second group of customers.

As one example, the first group of customers may be storing software code, e.g. instruction for processor 12 (see FIG. 1), which must remain stored for the lifetime of the product (e.g. twenty years). One example of such a product is an automobile which uses the NVM to store software code to perform engine control. This first group of customers may not require that the NVM perform many program/erase cycles. In this example, if the NVM stores software code, it is likely that the software code may never need to be erased and rewritten once it is initially stored in the NVM. Self-modifying software code is generally not used in most applications.

As a second example, the second group of customers may be storing data values, e.g. non-volatile but variable data, which need to remain stored for a relatively shorter period of time (e.g. one month to five year). One example of such a product is an automobile which uses the NVM to store data values to represent engine tuning information. This second group of customers will require that the NVM perform many program/erase cycles (e.g. one program/erase cycle every time the automobile ignition is turned off and on). In this example, if the NVM stores data values, it is likely that the data values will be refreshed by a new program/erase cycle and thus do not need to have a long data retention time.

In addition, some customers will require both types of NVM in the same application. For example, the automotive customers described above will need some NVM having long data retention for software code, and will also need some NVM having high endurance for data values that are rewritten frequently.

FIG. 1 illustrates, in block diagram form, an integrated circuit (IC) 10 in accordance with one embodiment of the present invention. In the illustrated embodiment, IC 10 has a processor 12, an NVM 14, optional other memory 16, one or more optional other module(s) 18, and an optional external bus interface 20, each of which is bi-directionally coupled to bus 22. As used herein, the term bus is used to refer to a plurality of signals or conductors which may be used to transfer one or more various types of information, such as data, addresses, control, or status.

In some embodiments, IC 10 is a stand alone NVM and circuits 12, 16, and 18 are not implemented. In this case, the external bus interface 20 includes the address and data bus drivers for the NVM 14. In other embodiments, IC 10 is a microcontroller which has an NVM 14 as just one circuit available on the microcontroller. Any one or more of circuits 12, 14, 16, 18, and 20 may be coupled to one or more integrated circuit terminals (not shown) which may be used to communicate external to IC 10. In some embodiments, external bus 24 may be used to communicate to circuitry (not shown) that is external to IC 10. Other memory 16 may be any type of memory. Other modules 18 may include circuitry that is used for any desired purpose. Some examples of circuitry in other modules 18 includes timer circuitry, communication interface circuitry, display driver circuitry, analog to digital converters, digital to analog converters, power management circuitry, etc.

Figure 2:
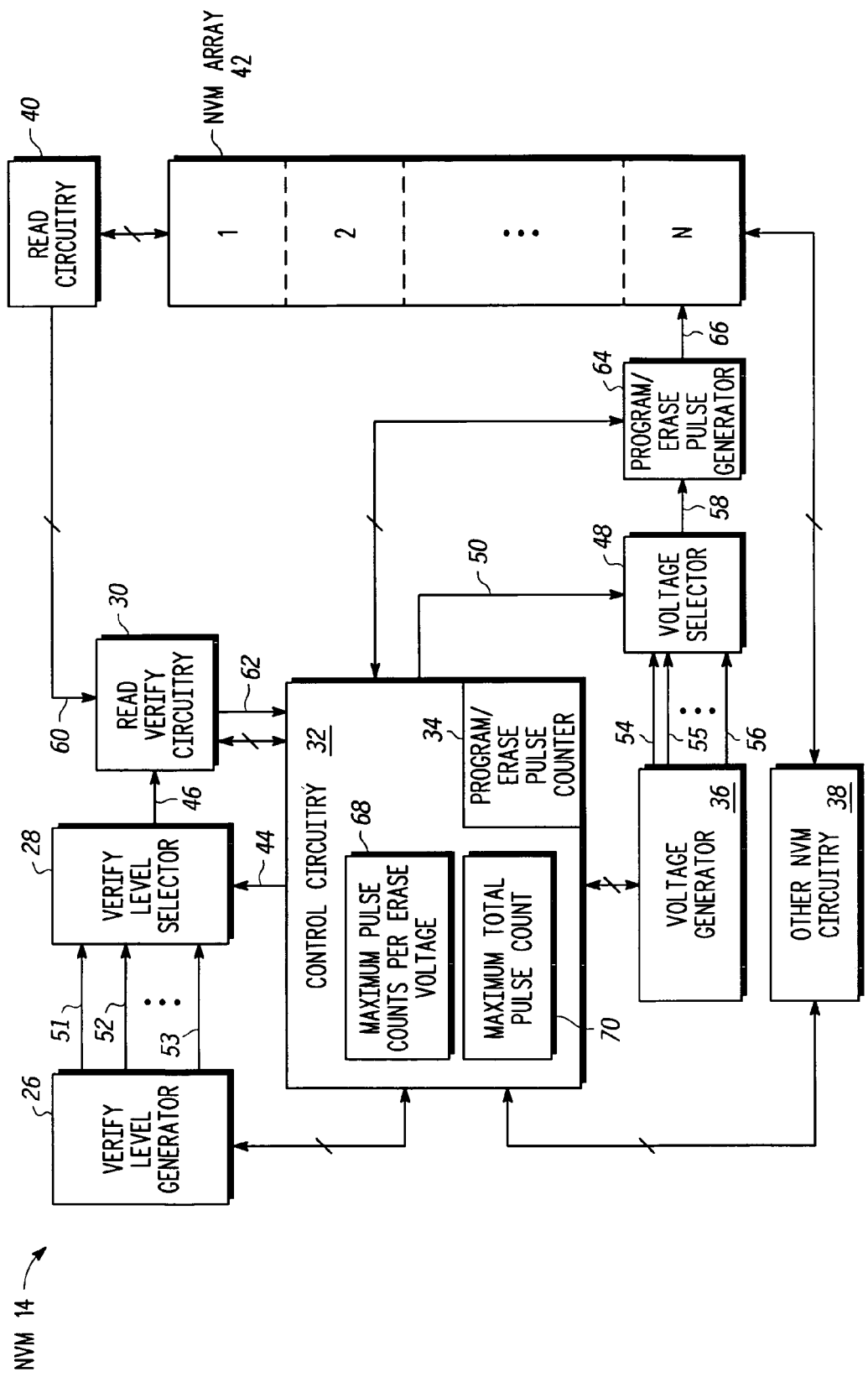
FIG. 2 illustrates, in block diagram form, an NVM 14 of FIG. 1 in accordance with one embodiment of the present invention.

FIG. 2 illustrates, in block diagram form, an NVM 14 of FIG. 1 in accordance with one embodiment of the present invention. In one embodiment, NVM 14 has an NVM array 42 having N blocks, wherein N can be any integer greater than or equal to one. Dashed lines are used to represent blocks of NVM array 42. These blocks can be of any size. Control information corresponding to each block may also be stored within each block.

NVM 14 also includes control circuitry 32, read circuitry 40, verify level generator 26, verify level selector 28, read verify circuitry 30, voltage generator 36, voltage selector 48, program/erase pulse generator 64, and other NVM circuitry 38. Verify level generator 26 provides a plurality of verify levels to verify level selector via conductors 51-53. Verify level selector 28 provides one of these verify levels via conductor 46 to read verify circuitry 30 based on a select signal received via conductor 44 from control circuitry 32. Read circuitry 40 is bi-directionally coupled to NVM array 42 and provides an actual read current via conductor 60 to read verify circuitry 30. Read verify circuitry 30 is bidirectionally coupled to control circuitry 32 and provides a verify result to control circuitry 32 via conductor 62. Control circuitry 32 is bidirectionally coupled to verify level generator 26, other NVM circuitry 38, voltage generator 36, and program/erase pulse generator 64. Voltage generator 36 provides a plurality of voltages via conductors 54-56 to voltage selector 48. Voltage selector 48 provides one of these voltages via conductor 58 to program/erase pulse generator 64 based on a select signal received via conductor 50 from control circuitry 32. Control circuitry 32 includes program/erase pulse counter 34, maximum pulse counts per voltage 68 and maximum total pulse count 70. Maximum pulse counts per voltage 68 and maximum total pulse count 70 may be stored in storage circuitry, such as, for example, registers, within control circuitry 32, or elsewhere within NVM 14 or IC 10.

A program/erase cycle may include the programming of all or a portion of NVM array 42 or erasing all or a portion of NVM array 42. In one embodiment, erase refers to setting a bit or bits to a logic level one, and programming refers to setting an appropriate bit or bits to a logic level one or a logic level zero, as needed, to represent the desired information to be stored in NVM array 42. In one embodiment, programming a portion of NVM array 42 includes an erase cycle to first erase all bits of the portion to be programmed, and then subsequently changing the state of those bits (to, e.g., a logic level zero) that need to be changed to represent the desired information to be stored. Also, note that a program/erase cycle, as used herein, may include just an erase operation. In one embodiment, an entire block may be erased at a time, or alternatively, more or less than a block may be erased at once. Also, in an alternate embodiment, erase may refer to the setting of a bit or bits to a logic level zero rather than a logic level one.

Upon programming or erasing a portion of NVM array 42, a subsequent verification is performed to determine that the program/erase cycle was successful. For the verification, a read of the programmed/erased bits is performed and compared to a verify level to determine if the bits were properly programmed/erased. For example, read verification circuitry 30 may be used to verify a proper erase of selected bitcells in NVM array 42. Read circuitry 40 includes a plurality of sense amplifiers (not shown) which are used to read the selected bitcell or bitcells that are to be verified. Read circuitry 40 senses each selected bitcell and provides an actual read current via conductor 60 to read verify circuitry 30. (Note that the circuitry and operation of read circuitry 40 is known in the art and therefore is not being described in more detail herein.) Read verify circuitry 30 then compares the actual read current received via conductor 60 with a selected verify level provided via conductor 46 and determines whether the actual read current is greater than or equal to the selected verify level. If so, then the stored value of the corresponding erased bitcell is verified as a logic level one, indicating that the erase was successful.

In one embodiment, an erase of a group of bitcells can be verified at once. For example, in the case where all bitcells of a portion of NVM array 42 are erased, they are all expected to be logic level ones after the erase. In this example, read circuitry 40 may sense each bitcell of the portion of NVM array 42 that was erased, and only provide the minimum actual read current to read verify circuitry 30. If the minimum actual read current in this case is greater than or equal to the selected verify level, then the erase of all the bitcells in the erased portion was successful.

Figure 4:
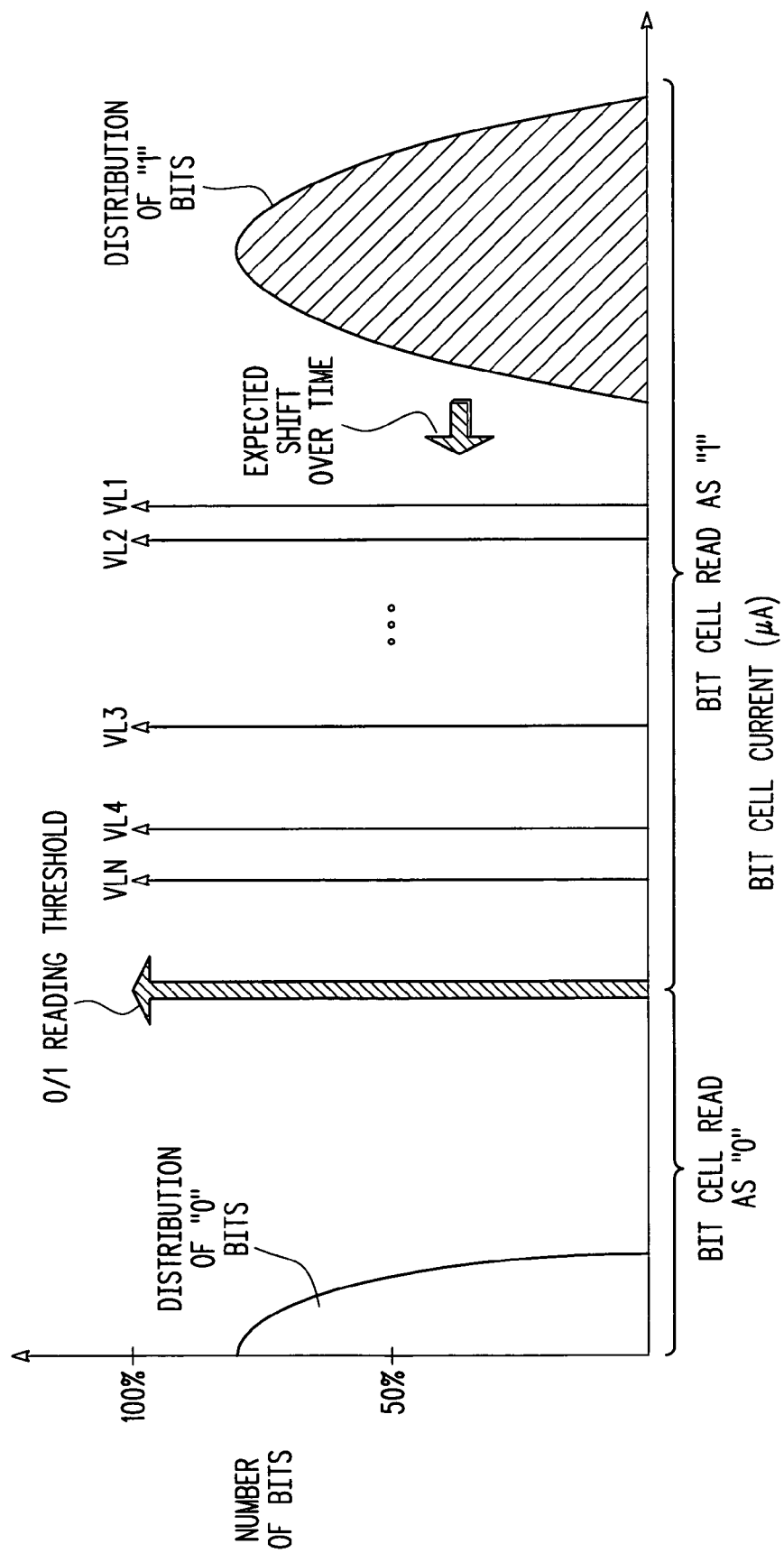
FIG. 4 illustrates, in graph form, a distribution of programmed and erased bits, in accordance with one embodiment of the present invention.

FIG. 4 illustrates, in graph form, an example distribution of zero ("0") bits and one ("1") bits which may be present in NVM array 42, and various different verify levels VL1-VLN. The y-axis represents the number of bits, while the x-axis represents bitcell currents of the bits. Therefore, in the case of "0" bits (bitcells having a stored logic level zero), the bitcell currents of each of the bitcells is less than a 0/1 reading threshold current. In the case of "1" bits (bitcells having a stored logic level one), the bitcell currents of each of the bitcells is greater than the 0/1 reading threshold current (otherwise, any "1" bit whose current is less than the 0/1 reading threshold current would be misread as a "0" bit). Therefore, any bitcell having a current below the 0/1 reading threshold current is read as storing a "0" and any bitcell having a current above the 0/1 reading threshold current is read as storing a "1". However, in order to ensure a strong one bit, it is desirable that the "1" bit bitcell currents are a predetermined amount greater than the 0/1 reading threshold current. For example, in FIG. 4, for optimal operation, the bitcell currents of the "1" bits should be greater than a verify level VL1. Therefore, as seen in FIG. 4, the distribution of "1" bits occurs to the right of VL1. However, over time, the distribution of "1" bits begins shifting to the left, closer to the 0/1 reading threshold, due, for example, to damage to the device oxides caused by program/erase cycles.

As illustrated in FIG. 4, note that the distribution of "1" bits may shift closer to the 0/1 reading threshold, but still be at least a predetermined amount away, as represented by various other verify levels VL2-VLN (where N can be any integer value). If, for example, verify level VL4 were used to verify "1" bits rather than VL1, more bits would "pass" as validly storing a "1" since a smaller bitcell current is necessary to be considered a valid "1" bit. However, if the bitcell current only surpasses VL4 and not VL1-VL3, then the "1" bit is actually a weaker "1" bit having a shorter lifespan left before the NVM degrades to the point that ones can no longer be reliably programmed. Therefore, in one embodiment, verify level VL1 is used as long as possible to verify a "1" bit, and when that is no longer possible, smaller verify levels such as VL2-VLN may instead be used to verify a "1" bit, thus possibly extending the life of NVM array 42.

Referring back to FIG. 2, note that read verify circuitry 30 may use one of a variety of verify levels (provided by verify level selector 28) to verify a "1" bit. For example, verify level generator 26 may generate N verify levels (corresponding, for example, to VL1-VLN of FIG. 4) and provide them via conductors 51-53 to verify level selector 28. Verify level selector 28 can then select one of these, based on a select signal received from control circuitry 32 via conductor 44, and provide the selected verify level to read verify circuitry 30 via conductor 46 for actually doing the verification. Read verify circuitry 30 then compares the actual read current received from read circuitry 40 with this selected verify level and provides a result, via conductor 62, to control circuitry 32. Operation of control circuitry 32 will be discussed in more detail in reference to the flow diagram of FIG. 3.

Figure 5:
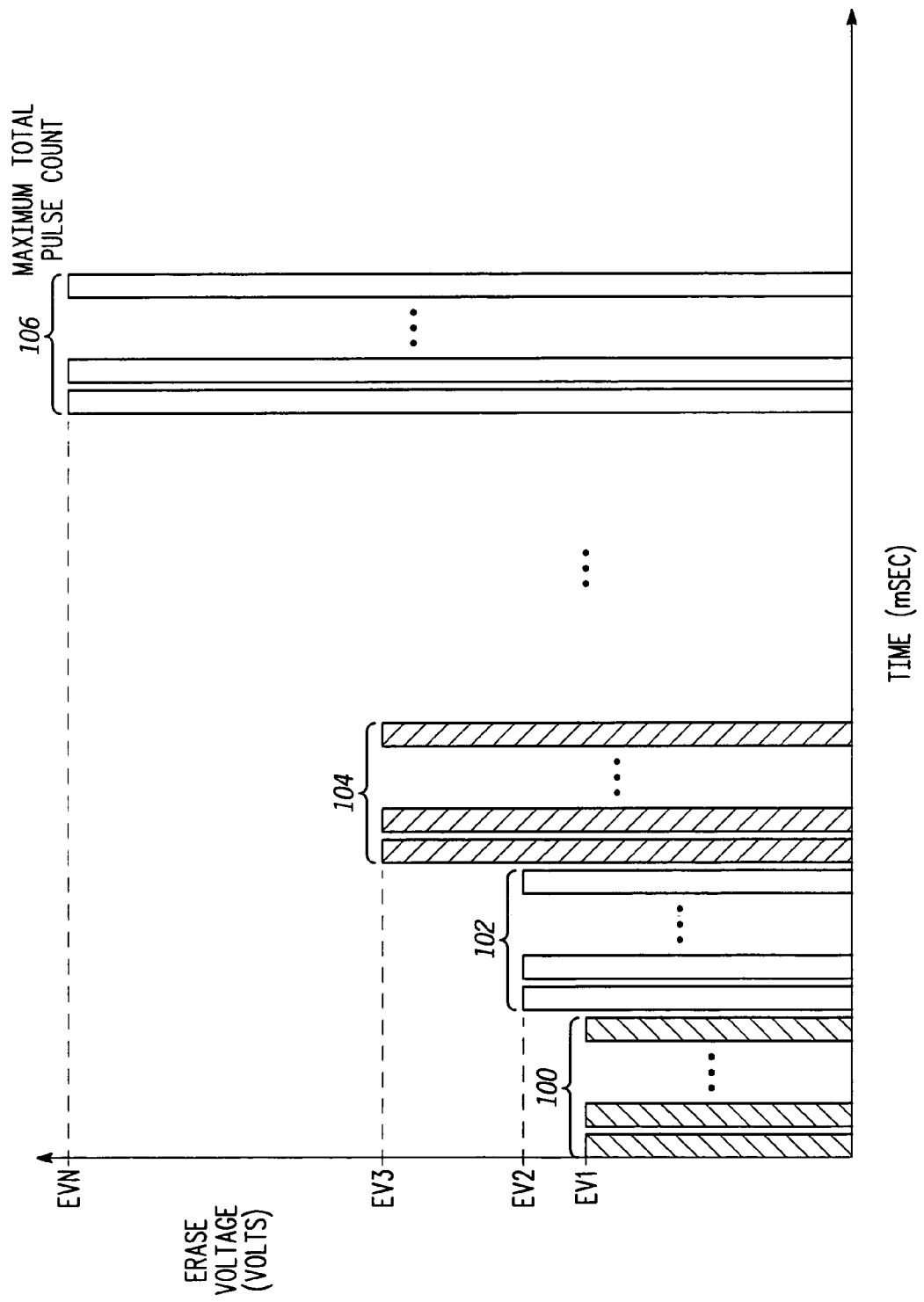
FIG. 5 illustrates, in graph form, various erase pulses in accordance with one embodiment of the present invention.

An example of a program/erase cycle which performs an erase operation to erase a portion of NVM array 42 will now be described in reference to FIGS. 2 and 5. In one embodiment, a plurality of erase pulses are generated, such as, by program/erase pulse generator 64, to erase a portion of NVM array 42. An example of these pulses is illustrated in FIG. 5. In one embodiment, a number of pulses (e.g., pulses 100) is applied having approximately a first erase voltage (EV1) before proceeding to apply a number of pulses (e.g., pulses 102) having approximately a second erase voltage (EV2) before proceeding to apply a number of pulses (e.g., pulses 104) having approximately a third erase voltage (EV3), etc. In one embodiment, after each pulse at the first erase voltage (e.g., EV1), a verification is performed to determine whether the erase pulse was successful. If not successful, then another erase pulse is provided at the same erase voltage, and it is then verified again. At any point where the verification verifies that the erase was successful, the program/erase cycle ends. However, if, after a predetermined number of pulses at a same erase voltage is performed (such as all of pulses 100), and the erase is still not successful, a pulse is provided at a higher erase voltage (e.g. EV2). Again, after each pulse at this higher erase voltage, verification is performed to see if the erase was successful, and if so, the program/erase cycle successfully ends at that point. However, if after a predetermined number of pulses at that higher erase voltage is performed (such as all of pulses 102), and the erase is still not successful, a pulse is provided at yet a higher erase voltage (e.g., EV3).

This process continues until a successful erase is verified or until a maximum total pulse count is reached. For example, if all of pulses 106 have been completed (meaning that all of pulses 100, 102, 104, . . . 106 have been completed) and the verification still does not indicate a successful erase, then the program/erase cycle ends without a successful erase (i.e. a failed erase). In one embodiment, the predetermined number of pulses provided per each erase voltage prior to moving to a higher erase voltage is the same. For example, a maximum of 5 pulses may be provided for each erase voltage, with a maximum total number of pulses being 20. However, in alternate embodiments, the number of pulses provided per each erase voltage prior to moving to a higher erase voltage is different. These values may be stored, for example, in maximum pulse counts per voltage 62 and maximum total pulse count 70 of FIG. 2. Alternatively, this type of information may be stored within each block of NVM array 42, where each block may use different counts. Also, erase pulse counter 34 may include any number of counters or other circuitry to keep track of the number of pulses per erase voltage and the total number of pulses. Note that the use of pulses having increasingly higher erase voltages may result in less damage to NVM array 42.

Therefore, note that each program/erase cycle may use multiple different erase voltages and multiple different verify levels. For example, verify level selector 28 may select a first verify level during a first portion of a program/erase cycle and then select a second verify level during a second portion (which occurs, in time, after the first portion) of the program/erase cycle (if, for example, the erase pulses at the first verify level were unsuccessful). Therefore, during the first portion of the program/erase cycle, read verify circuitry 30 may compare a first actual read current and the first verify level and during the second portion of the program/erase cycle, read verify circuitry 30 may compare a second actual read current to the second verify level.

In the illustrated embodiment, other NVM circuitry 38 of FIG. 2 includes all other circuitry necessary for the operation of NVM 14. In one embodiment, other NVM circuitry 38 has a charge pump, high voltage regulator, high voltage switches, word line drivers, source line drivers, row decoders, column decoders, an interface to bus 22, registers, and any other circuitry that is desired for the functionality of NVM 14 (not shown). Note that for one embodiment, other NVM circuitry 38 may operate in a conventional manner. Also, note that circuitry similar to read verify circuitry 30 may be used to verify "0" bits where the bitcell currents of "0" bits are compared against a verify level that is typically less than the 0/1 reading threshold current to determine validity. Also, in an alternate embodiment, bitcells having currents less than the 0/1 reading threshold current may correspond to "1" bits while those bitcells having currents greater than the 0/1 reading threshold current may correspond to "0" bits.

Figure 3:
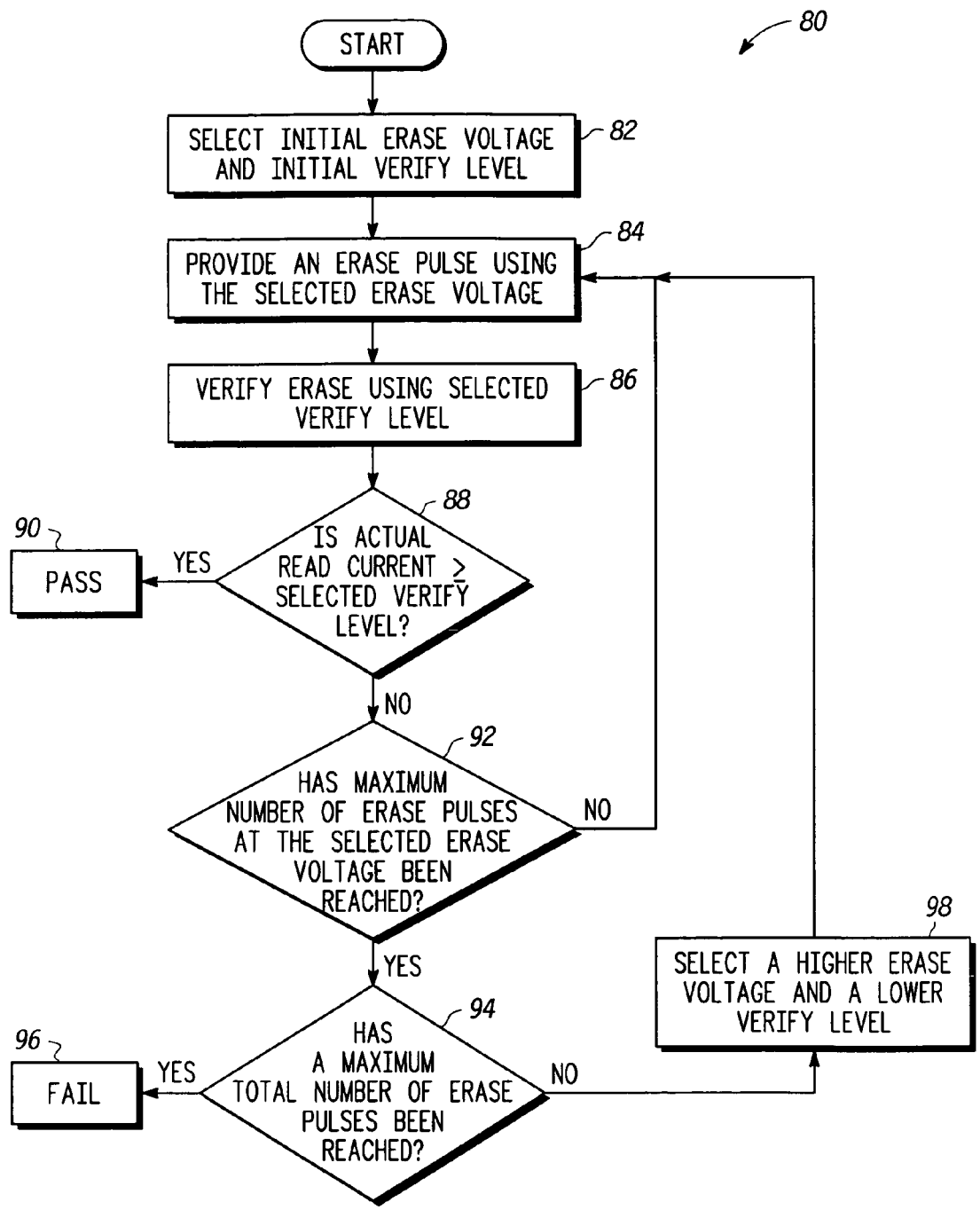
FIG. 3 illustrates, in flow diagram form, a method for erasing an NVM in accordance with one embodiment of the present invention.

FIG. 3 illustrates, in flow diagram form, an erase and verify procedure in accordance with one embodiment of the present invention. Stimulus external to NVM array 42 may be used to initiate an erase operation of flow 80. One example of such an external stimulus may be processor 12 (see FIG. 1) initiating an erase within NVM 14. Flow starts with block 82 where an initial erase voltage and an initial verify level are selected. For example, initially, control circuitry 32 may indicate to verify level selector 28 (via, e.g., conductor 44) to select a first verify level (e.g. VL1 in FIG. 4) from verify level generator. Similarly, control circuitry 32 may indicate to voltage selector 48 (via, e.g., conductor 50) to select a first erase voltage (e.g. EV1) from voltage generator 36.

Flow then proceeds to block 84 where an erase pulse is provided using the selected erase voltage (selected in block 82). For example, program/erase pulse generator 64 may use the erase voltage provided by voltage selector 48 to generate a pulse, as shown, for example, in FIG. 5. Note that control circuitry 32 may also provide control information to program/erase pulse generator 64, such as relating to the duration of the pulse. This first pulse is provided to NVM array 42 to erase a selected portion of NVM array 42 (where the selected portion can be indicated, as known in the art, by other NVM circuitry 38).

Referring back to FIG. 3, flow then proceeds to block 86 where the erase is verified using the selected verify level. For example, once the pulse is provided by pulse generator 64, read verify circuitry 30 may verify the erase as was described above in reference to FIG. 2. For example, read circuitry 40 may provide an actual read current to read verify circuitry 30 which compares it to the selected verify level from verify level selector 28. Flow then proceeds to decision diamond 88 where it is determined whether the actual read current is greater than or equal to the selected verify level. If so, flow proceeds to block 90 which indicates a successful erase, and thus, a program/erase cycle has been completed. That is, at block 90, the erase operation of flow 80 is completed. If, at decision diamond 88, it is determined that the actual read current is not greater than or equal to the selected verify level, flow proceeds to decision diamond 92.

At decision diamond 92, it is determined whether the maximum number of erase pulses at the selected voltage level has been reached. If not, flow returns to block 84 where another erase pulse is provided at the same selected voltage level, and a verify is performed at the same verify level (at block 86). If, at decision diamond 92, it is determined that the maximum number of erase pulses at the selected voltage level has been reached, then flow proceeds to decision diamond 94. For example, to make the determination of decision diamond 92, control circuitry 32 may compare the count of a first erase pulse counter keeping track of the number of pulses at the current erase voltage to the maximum pulse count for the current erase voltage (which may be stored, for example, as part of maximum pulse counts per erase voltage 68).

At decision diamond 94, it is determined whether the maximum total number of erase pulses has been reached. For example, control circuitry 32 may compare the count of a second erase pulse counter keeping track of the number of pulses total in the current program/erase cycle to maximum total pulse count 70 to make this determination. If the maximum total number of erase pulses has been reached, then flow proceeds to block 96 which indicates that the current program/erase cycle has ended with an unsuccessful erase (i.e. a failed erase). Note that a failure during erasing or programming may be due to circuitry in NVM array 42 and/or in other NVM circuitry 38.

However, if at decision diamond 94 the maximum total number of erase pulses has not yet been reached, flow proceeds to block 98 where the current program/erase cycle continues. At block 98, a higher erase voltage and a lower verify level is selected, and flow returns to block 84. For example, if the initial erase voltage and verify level at block 82 corresponded to EV1 and VL1, respectively, then, at block 98, the higher erase voltage and lower verify level may correspond to EV2 and VL2, respectively. With this new higher erase voltage, a stronger erase pulse is provided to NVM array 42 to perform the erase. Furthermore, after each erase pulse at this higher erase voltage, a verify is performed using a lower verify level. This lower verify level may make it easier for read verify circuitry 30 to verify a successful erase. That is, each program/erase cycle may use multiple different erase voltages and multiple different verify levels. By using incrementally higher erase voltages (e.g., EV1, EV2, . . . EVN) with incrementally lower verify levels (e.g., VL1, VL2, . . . VLN, respectively), an erase may be performed and verified in such a way as to minimize damage caused by the program/erase cycle and to ensure that the optimal data retention and endurance performance is achieved for every bitcell in the NVM array regardless of application.

Note that any sequence of erase voltages and verify levels may be selected. For example, each erase voltage in the sequence of erase voltages to be used may be evenly spaced apart. Alternatively, they may not be equally spaced apart, such that, for example, the jump from EV1 to EV2 may be smaller than the subsequent jump from EV2 to EV3. Also, each erase voltage may not necessarily be greater than the previous erase voltage. Similarly, each verify level in the sequence of verify levels to be selected may be evenly spaced apart or not evenly spaced apart. Also, each verify level may not necessarily by lower than the previous verify level. In one embodiment, the sequence of erase voltages starts at 13 Volts and increments by 200 milivolts each time up to 14 Volts, as follows: 13 Volts, 13.2 Volts, 13.4 Volts . . . 14 Volts (corresponding to EV1, EV2, EV3, . . . EVN, respectively), and the sequence of verify levels starts at 30 microamps and decrements by 4 microamps each time down to 10 microamps, as follows: 30 microamps, 26 microamps, 22 microamps, . . . 10 microamps (corresponding to VL1, VL2, VL3, . . . VLN, respsectively). However, as described above, many different sequences may be used for each of the erase voltages and the verify levels.

Note also that for one embodiment, the verify level is a reference current which is compared to the actual read current from the NVM cell. Alternate embodiments may use something other than a reference current to represent the verify level. For example, the verify level may be a reference voltage. Also, the reference may be compared to something other than read current. For example, the verify level may be a reference voltage that is compared to an NVM cell voltage (e.g. transistor threshold voltage). Alternate embodiments may use any desired circuit characteristic to represent the verify level. Therefore, in one embodiment, the verify level may be referred to as a read current/voltage threshold, and the actual read current may be referred to as the actual read current/voltage. Also, in one embodiment, verify level selector 28 may be referred to as a threshold selector.

Note that the NVM 14 may include other configurations other than the one illustrated in FIG. 2. For example, verify level generator 26 and verify level selector 28 may be implemented in a variety of ways. In one embodiment, verify level generator 26 may be able to generate any number of verify levels (either currents or voltages, depending on the desired type of comparison), and verify level selector 28 may then select one of these based on a select signal from control circuitry 32. For example, verify level 28 may either select from various generated verify levels, or may select the circuitry to be enabled within verify level generator 26 to generate the selected verify level. Alternatively, these functions may be combined into a single block. Also, in one embodiment, each subsequent verify level may be generated from the initial verify level or any other previous verify level. The same alternatives described in reference to verify level generator 26 and verify level selector 28 also apply to voltage generator 36 and voltage selector 48, respectively. Also, control circuitry 32 may provide any type of control signal(s), as necessary, to indicate which verify level and erase voltage to select or generate.

Also, any type of known circuitry may be used to implement parts of NVM 14. For example, any type of current/voltage level generators may be used to implement verify level generator 26 and voltage generator 36. Similarly, any type of circuitry may be used to implement the selecting function of selectors 28 and 48 (such as, for example, a multiplexer). Also, known circuitry may be used to implement the counter or counters of program/erase pulse counter 34 and to implement program/erase pulse generator 64. Also, control circuitry 32 may be implemented in software running on processor 12 or as hardware implementing, for example, the control of flow 80, or as a combination of hardware and software. Portions of control circuitry 32 may also be distributed and located throughout NVM 14, and may not be centralized, as illustrated in FIG. 2. Control circuitry 32 may also be used to provide control information and signals to any portion of NVM 14 relating to any function of NVM 14. Also, note that the specific portions of NVM 14 described herein, such as, for example, generators 26 and 36, selectors 28 and 48, read verify circuitry 30, program/erase pulse generator 64, and control circuitry 32 may also perform or aid in performing other functions of NVM 14, such as programming or verifying "0" bits. Note also that embodiments of the present invention are applicable to any type of NVM which can be programmed and erased a plurality of times.

One embodiment of the present invention relates to a method for programming/erasing a non-volatile memory (NVM) including initiating an erase operation of at least a portion of the NVM using a first erase voltage, selecting a first read current/voltage threshold, determining a first actual read current/voltage of the at least the portion of the NVM and comparing the first actual read current/voltage and the first read current/voltage threshold. If the first actual read current/voltage is lower than the first read current/voltage threshold, the method further includes applying at least one erase pulse to the at least the portion of the NVM, selecting a second read current/voltage threshold, determining a second actual read current/voltage of the at least the portion of the NVM, and comparing the second actual read current/voltage and the second read current/voltage threshold. If the second actual read current/voltage is not lower than the second read current/voltage threshold, the erase operation is completed. The first read current/voltage threshold and the second read current/voltage threshold are different.

In a further embodiment, the at least one erase pulse comprises a first plurality of first erase pulses. The first plurality of first erase pulses includes N erase pulses, wherein N may be determined by a value stored in the NVM. Each of the first plurality of first erase pulses may have approximately a first voltage.

In yet a further embodiment, if the second actual read current/voltage is lower than the second read current/voltage threshold, the method may further include applying a second plurality of second erase pulses to the at least the portion of the NVM wherein each of the second erase pulses has approximately a second voltage and wherein the second voltage is different than the first voltage. The second voltage may be more than the first voltage. The second plurality may be a same number as the first plurality. The NVM may be considered to have failed if the first plurality added to the second plurality has reached a predetermined maximum total number of erase pulses, and if the second actual read current/voltage is lower than the second read current/voltage threshold.

In a further embodiment, the second read current/voltage threshold is less than the first read current/voltage threshold.

Another embodiment relates to an integrated circuitry having non-volatile memory (NVM) including a threshold selector which selects a first one of a plurality of read current/voltage thresholds during a first portion of a program/erase cycle, and which selects a second one of a plurality of read current/voltage thresholds during a second portion of said program/erase cycle, wherein the first one of a plurality of read current/voltage thresholds and the second one of a plurality of read current/voltage thresholds are different.

In a further embodiment, the first portion of the program/erase cycle occurs in time before the second portion of the program/erase cycle, and wherein the second one of the plurality of read current/voltage thresholds is less than the first one of the plurality of read current/voltage thresholds.

In another further embodiment, the integrated circuit further includes a read verify circuitry for comparing a first actual read current/voltage and the first one of a plurality of read current/voltage thresholds during the first portion of a program/erase cycle, said read verify circuitry also comparing a second actual read current/voltage and the second one of a plurality of read current/voltage thresholds during the second portion of said program/erase cycle, wherein said read verify circuitry is coupled to said threshold selector. In yet a further embodiment, the integrated circuit further includes an erase pulse generator which applies at least one first erase pulse to the NVM if the first actual read current/voltage is lower than the first one of the plurality of read current/voltage thresholds, said erase pulse generator also applying at least one second erase pulse to the NVM if the second actual read current/voltage is lower than the second one of the plurality of read current/voltage thresholds. In another further embodiment, the at least one first erase pulse includes a first plurality of erase pulses having a first voltage, wherein the at least one second erase pulse comprises a second plurality of erase pulses having a second voltage. The second voltage may be higher than the first voltage.

Another alternate embodiment relates to a non-volatile memory (NVM) including an NVM array, means for generating a plurality of read current/voltage thresholds, means for selecting a first one of the plurality of read current/voltage thresholds during a first portion of a program/erase cycle, and for selecting a second one of the plurality of read current/voltage thresholds during a second portion of said program/erase cycle, means for comparing a first actual read current/voltage and the first one of a plurality of read current/voltage thresholds during the first portion of a program/erase cycle, and for comparing a second actual read current/voltage and the second one of a plurality of read current/voltage thresholds during the second portion of said program/erase cycle, and means for providing a first plurality of first erase pulses to the NVM array if the first actual read current/voltage is lower than the first one of a plurality of read current/voltage thresholds, and providing a second plurality of second erase pulses to the NVM array if the second actual read current/voltage is lower than the second one of a plurality of read current/voltage thresholds.

In a further embodiment, the first portion of the program/erase cycle occurs in time before the second portion of the program/erase cycle, and wherein the second one of the plurality of read current/voltage thresholds is less than the first one of the plurality of read current/voltage thresholds. In another further embodiment, the first plurality of first erase pulses have a first voltage, and wherein the second plurality of second erase pulses have a second voltage. In yet a further embodiment, the second voltage is higher than the first voltage, and in yet a further embodiment, the second plurality is a same number as the first plurality.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for programming/erasing a non-volatile memory (NVM), comprising:
    initiating an erase operation of at least a portion of the NVM using a first erase voltage;
    selecting a first read current/voltage threshold;

determining a first actual read current/voltage of the at least the portion of the NVM;
comparing the first actual read current/voltage and the first read current/voltage threshold;
if the first actual read current/voltage is lower than the first read current/voltage threshold, performing the following steps:
applying at least one erase pulse to the at least the portion of the NVM;
selecting a second read current/voltage threshold;
determining a second actual read current/voltage of the at least the portion of the NVM;
comparing the second actual read current/voltage and the second read current/voltage threshold; and
if the second actual read current/voltage is not lower than the second read current/voltage threshold, completing the erase operation,
wherein the first read current/voltage threshold and the second read current/voltage threshold are different.

2. A method as in claim 1, wherein the at least one erase pulse comprises a first plurality of first erase pulses.

3. A method as in claim 2, wherein the first plurality of first erase pulses comprises N erase pulses, wherein N is determined by a value stored in the NVM.

4. A method as in claim 2, wherein each of the first plurality of first erase pulses has approximately a first voltage.

5. A method as in claim 4, further comprising:
if the second actual read current/voltage is lower than the second read current/voltage threshold, performing the following steps:
applying a second plurality of second erase pulses to the at least the portion of the NVM,
wherein each of the second erase pulses has approximately a second voltage, and
wherein the second voltage is different than the first voltage.

6. A method as in claim 5, wherein the second voltage is more than the first voltage.

7. A method as in claim 5, wherein the second plurality is a same number as the first plurality.

8. A method as in claim 5, wherein the NVM is considered to have failed if the first plurality added to the second plurality has reached a predetermined maximum total number of erase pulses, and if the second actual read current/voltage is lower than the second read current/voltage threshold.

9. A method as in claim 1, wherein the second read current/voltage threshold is less than the first read current/voltage threshold.

10. An integrated circuit having non-volatile memory (NVM), comprising:
threshold selector which selects a first one of a plurality of read current/voltage thresholds during a first portion of a program/erase cycle, and which selects a second one of a plurality of read current/voltage thresholds during a second portion of said program/erase cycle,
wherein the first one of a plurality of read current/voltage thresholds and the second one of a plurality of read current/voltage thresholds are different.

11. An integrated circuit as in claim 10, wherein the first portion of the program/erase cycle occurs in time before the second portion of the program/erase cycle, and wherein the second one of the plurality of read current/voltage thresholds is less than the first one of the plurality of read current/voltage thresholds.

12. An integrated circuit as in claim 10, further comprising:
read verify circuitry for comparing a first actual read current/voltage and the first one of a plurality of read current/voltage thresholds during the first portion of a program/erase cycle, said read verify circuitry also comparing a second actual read current/voltage and the second one of a plurality of read current/voltage thresholds during the second portion of said program/erase cycle, wherein said read verify circuitry is coupled to said threshold selector.

13. An integrated circuit as in claim 12, further comprising:
erase pulse generator which applies at least one first erase pulse to the NVM if the first actual read current/voltage is lower than the first one of the plurality of read current/voltage thresholds, said erase pulse generator also applying at least one second erase pulse to the NVM if the second actual read current/voltage is lower than the second one of the plurality of read current/voltage thresholds.

14. An integrated circuit as in claim 12, wherein the at least one first erase pulse comprises a first plurality of erase pulses having a first voltage, wherein the at least one second erase pulse comprises a second plurality of erase pulses having a second voltage.

15. An integrated circuit as in claim 14, wherein the second voltage is higher than the first voltage.

16. A non-volatile memory (NVM), comprising:
an NVM array;
means for generating a plurality of read current/voltage thresholds;
means for selecting a first one of the plurality of read current/voltage thresholds during a first portion of a program/erase cycle, and for selecting a second one of the plurality of read current/voltage thresholds during a second portion of said program/erase cycle;
means for comparing a first actual read current/voltage and the first one of a plurality of read current/voltage thresholds during the first portion of a program/erase cycle, and for comparing a second actual read current/voltage and the second one of a plurality of read current/voltage thresholds during the second portion of said program/erase cycle; and
means for providing a first plurality of first erase pulses to the NVM array if the first actual read current/voltage is lower than the first one of a plurality of read current/voltage thresholds, and providing a second plurality of second erase pulses to the NVM array if the second actual read current/voltage is lower than the second one of a plurality of read current/voltage thresholds.

17. An NVM as in claim 16, wherein the first portion of the program/erase cycle occurs in time before the second portion of the program/erase cycle, and wherein the second one of the plurality of read current/voltage thresholds is less than the first one of the plurality of read current/voltage thresholds.

18. An NVM as in claim 16, wherein the first plurality of first erase pulses have a first voltage, and wherein the second plurality of second erase pulses have a second voltage.

19. An NVM as in claim 18, wherein the second voltage is higher than the first voltage.

20. An NVM as in claim 19, wherein the second plurality is a same number as the first plurality.

* * * * *